US012772421B2

(12) United States Patent
Auweter et al.

(10) Patent No.: US 12,772,421 B2

(45) Date of Patent: Oct. 20, 2026

(54) METHOD FOR AIR-CONDITIONING COMPONENTS WHICH GENERATE LOSSES OR WASTE HEAT, IN PARTICULAR COMPONENTS OF A DATA CENTER

(71) Applicant: MEGWARE Computer Vertrieb und Service GmbH, Chemnitz-Röhrsdorf (DE)

(72) Inventors: Axel Auweter, Markkleeberg (DE); Wolfgang Trepte, Diera-Zehren (DE)

(73) Assignee: MEGWARE Computer Vertrieb und Service GmbH, Chemnitz-Röhrsdorf (DE)

( * ) Notice: Subject to any disclaimer, the term of this patent is extended or adjusted under 35 U.S.C. 154(b) by 383 days.

(21) Appl. No.: 18/540,181

(22) Filed: Dec. 14, 2023

(65) Prior Publication Data

US 2024/0244801 A1 Jul. 18, 2024

(30) Foreign Application Priority Data

Jan. 17, 2023 (DE) ......................... 102023101055.7
Apr. 6, 2023 (DE) ......................... 102023108888.2

(51) Int. Cl.
*H05K 7/20* (2006.01)

(52) U.S. Cl.
CPC ..... *H05K 7/20818* (2013.01); *H05K 7/20836* (2013.01)

(58) Field of Classification Search
CPC ........... H05K 7/20818; H05K 7/20836; H05K 7/2079
See application file for complete search history.

(56) References Cited

U.S. PATENT DOCUMENTS 4,457,358 A * 7/1984 Kriege ...................... F24F 3/06 62/305
6,419,454 B1 * 7/2002 Christiansen ......... F04B 49/065 417/4
2024/0098933 A1 * 3/2024 Weisemann ....... H05K 7/20745

FOREIGN PATENT DOCUMENTS

DE 202019101219 U1 3/2019 .............. F24V 99/00
DE 102019127752 A1 4/2021 ............... G06F 1/20
EP 3287717 A1 2/2018 .............. F24D 11/02

OTHER PUBLICATIONS

Search Report (in German), dated Aug. 28, 2023, issued by the German Patent Office for Applicant's corresponding German Patent Application No. DE102023108888.2, filed Apr. 6, 2023.

* cited by examiner

*Primary Examiner* — Charles Cai

(74) *Attorney, Agent, or Firm* — Bodner & Bodner, PLLC; Christian P. Boder; Gerald T. Boder

(57) ABSTRACT

The invention relates to a method for air-conditioning components which generate losses or waste heat, in particular components of a data center, wherein the entirety of the components is located in an enclosure, in particular a container, and the components are directly coupled to a first cooling water circuit on the one hand and indirectly connected via a second cooling water circuit to an air heat exchanger on the other hand.

13 Claims, 5 Drawing Sheets

Mixed operation
Simultaneous heating and cooling
One heat pump off

Heat pump as heating
Winter operation

Emergency heating upon failure of IT

METHOD FOR AIR-CONDITIONING COMPONENTS WHICH GENERATE LOSSES OR WASTE HEAT, IN PARTICULAR COMPONENTS OF A DATA CENTER

The invention relates to a method for air-conditioning components which generate losses or waste heat, in particular components of a data center, wherein the entirety of the components is located in an enclosure, in particular a container, wherein the components are directly coupled to a first cooling water circuit on the one hand and indirectly connected via a second cooling water circuit to an air heat exchanger on the other hand, according to claim 1.

DE 10 2019 127 752 A1 discloses a data center containing a computing system arranged in a room, wherein the computing system has multiple heat sinks and multiple processors, of which each processor is thermally coupled to a heat sink of the multiple heat sinks. Furthermore, a heat pump is provided there and a gas-liquid heat exchanger arranged in the room.

There is also a hot liquid circuit which couples the multiple heat sinks to the gas-liquid heat exchanger, wherein the hot liquid circuit has a hot liquid connection on one wall of the room with the computers. There is also a cold liquid circuit, which couples the heat pump to the gas-liquid heat exchanger. The heat pump is adapted to extract thermal energy from the cold liquid circuit and supply it to the hot liquid circuit.

The above-mentioned concept is intended to dissipate a large amount of waste heat from a large number of processors in order to cool the data center sufficiently.

With the solution presented, it should be possible to operate a data center with sufficient cooling all year round, even if no natural heat sinks are available, which depends on the season.

The presented cooling infrastructure with two heat circuits, in particular water circuits, which have a different temperature level, is coupled by means of a heat pump. During operation, heat is extracted from the air inside the room with the computers using the low temperature level. The heat is raised to a higher temperature level with the aid of the heat pump and fed into the higher temperature level, which enables the heat to be removed. The energy at a higher temperature should be available for economic use. In an embodiment according to the teaching according to DE 10 2019 127 752 A1, the room for accommodating a large number of computers can be set up as a container.

EP 3 287 717 A1 discloses a method for operating a cascade connection of multiple cooling and/or heating systems.

The cascade connection is activated when the temperature measured by a temperature sensor falls below a setpoint value for heating systems or exceeds it for cooling systems. Subsequently, a time recording is started and there is the option of modulating operation, wherein all connected systems are initially operated up to a specified partial load and the load is increased after partial load operation.

With regard to the prior art, reference should also be made to the heat recovery system for recovering waste heat from industrial liquids at low temperatures according to DE 20 2019 101 219 U1.

According to the prior art described above, it can be summarized that the cooling of container-based data centers with a large number of processors or computer nodes is known. In this case, so-called cold water cooling, also combined with hot water cooling, is used.

In cold water cooling, cold water is fed through a heat exchanger. This heat exchanger is located, for example, on one of the side surfaces, in particular the rear side of computer cabinets. The air heated by the computers is cooled by the heat exchangers immediately before or as it exits the computer cabinet, so that the surrounding room in which the computers are located, for example a container, does not heat up excessively despite the computers being in operation.

With hot water cooling, cooling water is fed directly to particularly powerful computer components and the heat generated there is dissipated without air as a heat exchanger. The cooling water flows through specially designed heat sinks that are optimally connected to integrated circuits, especially processors, in a thermally conductive manner. The efficiency of this type of cooling also allows operation with relatively warm water, so that no process cooling is required.

The thermal energy generated can be released directly into the ambient air via a recooling unit without a chiller.

From the foregoing, it is the object of the invention to provide a further developed method for air conditioning components which generate heat loss or waste heat, in particular components of a data center, wherein the thermal energy which is introduced into a cold water cooling system known per se can be used to heat adjacent premises as required. In addition, it should also be possible to use thermal energy from the circuit of a hot water cooling system if required.

Furthermore, it must be ensured that the connected room heating, for example located in a separate container, is also guaranteed if the computer technology fails and therefore no waste heat is available.

The object of the invention is solved by the teaching according to the method according to claim 1 and the application according to claim 12, wherein the subclaims represent at least useful embodiments and further developments.

Accordingly, the invention is based on a method for air-conditioning components that generate losses or waste heat, in particular components of a data center, wherein the entirety of the components is located in an enclosure, in particular a container.

The components are connected directly to a first cooling water circuit on the one hand and indirectly via a second cooling water circuit to an air heat exchanger on the other, in line with the cold water and hot water cooling method described above.

According to the invention, a cascade of heat pumps which can be activated individually or in groups and are connected in parallel is provided to generate cooling for the second cooling water circuit. This can involve up to eight or more cascaded heat pumps.

On the condenser side of the respective heat pump, a three-way valve can be used to switch from cooling mode for generating cooling to heating mode for a connected or connectable heating circuit.

To increase efficiency in cooling mode, the condensation temperature on the condenser side of the respective heat pump is selected to be lower than in heating mode.

On the condenser side, a controllable throttle valve is arranged downstream of the respective heat pump so that the volume flow can be preset.

A flow sensor is installed in the heating circuit on the building side. This can be used to detect a heating requirement and trigger the operation of a pump, whereby the heating water is conveyed in the circuit between a heat exchanger and the respective active heat pump(s).

According to the invention, the heat pumps are to be operated alternately or in rotation, so that a number of operating hours that is as uniform as possible can be achieved.

To control the heat pumps feeding into the heating circuit in summer or transitional mode, preference is given to those which were or are already in operation due to component cooling.

For emergency air-conditioning operation in the event of failure of the waste-heat-generating components, at least one of the heat pumps can be switched to operate as an air-to-water heat pump.

The heat pumps mentioned are connected to a recooler located on the outside of the enclosure or in the container mentioned.

To transfer thermal energy from the second cooling water circuit with air heat exchanger to the first cooling water circuit, a bypass is provided in accordance with one embodiment of the invention, which can be activated accordingly. Preferably, the bypass is realized via a controllable three-way valve.

A further three-way valve establishes a direct connection between the first or second cooling water circuit and the recooler for so-called free cooling operation.

The three-way valve can also be used to decouple the components and the aforementioned three-way valve can be used to establish a connection to the recooler in order to recover thermal energy from the environment.

The application according to the invention consists in using the method as described for cooling and air conditioning a container-based data center and connected premises to be heated for administration and operating personnel, wherein the computers are cooled via cold water-fed heat exchangers on or in the computer housings for cooling heated air and indirect hot water cooling of powerful computer components.

In principle, the computers or computer nodes are cooled by two separate water circuits, wherein one water circuit directly cools the particularly waste-heat-intensive components and the other, second water circuit provides indirect cooling via air-water heat exchangers. The components cooled in this way can include, for example, other circuit boards, power supply units or similar.

The connected water circuit can be used for heating or cooling via the heat pumps installed in a cascade. The corresponding switching between cooling mode and heating mode takes place via three-way valves provided, wherein the condensation temperature on the condenser side of the heat pumps is set lower than in heating mode to increase efficiency in cooling mode. In this respect, throttle valves are used which are able to throttle the volume flow for cooling the corresponding condenser until the desired setpoint temperature for heating mode has been reached.

If the water temperatures are above the outside temperature measured by a temperature sensor and there is no need for heating, cooling can take place directly via the free cooler with appropriate switching by means of a three-way valve.

At cooling water temperatures below the outside temperature, the heat pumps are switched on in stages depending on the required cooling capacity.

In principle, heat pumps in the cascade in heating mode can be switched at the same time as other heat pumps in the cascade in cooling mode.

The invention will be explained in more detail below with reference to an exemplary embodiment example and the figures.

SUPPLEMENT

In the figures, the same reference symbols are used for the same parts or components. In addition, the figures use conventional representations and symbols of hydraulic elements. The capital letter “K” indicates the cold water supply and the capital letter “W” indicates the hot water supply, wherein.

Figure 1:
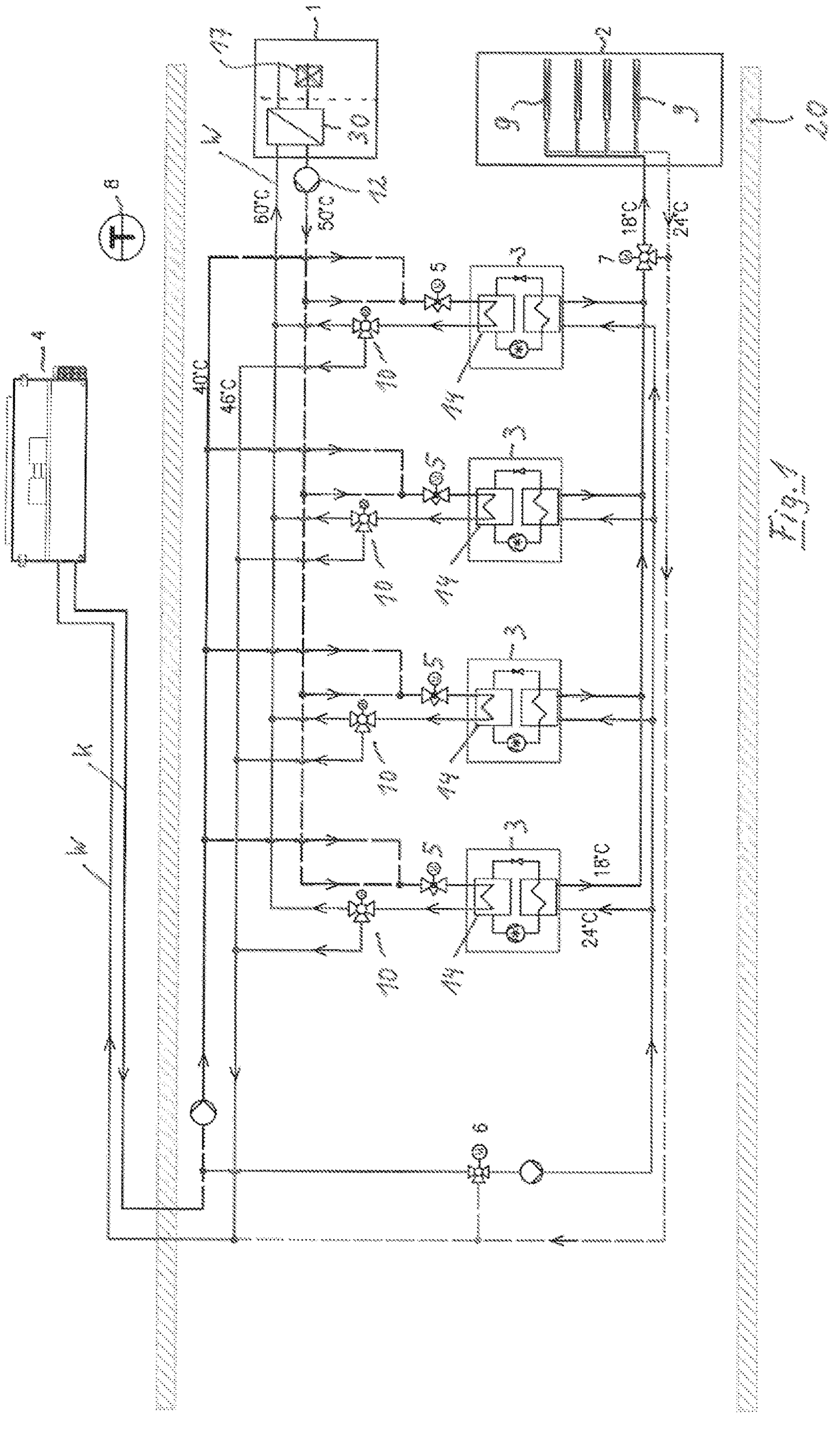
FIG. 1 shows a simplified hydraulic diagram of an arrangement with the aid of which the method according to the invention can be operated.

In the figures, the reference sign 20 symbolizes a container that holds a computer system with corresponding server cooling 2. A temperature sensor 8 is located outside the container in order to be able to determine the ambient temperature.

For example, there is a recooler 4 on the top of the container 20, which is hydraulically connected to the rest of the system.

The arrangement for carrying out the method also comprises multiple, in the example shown four, cascaded, parallel-connectable heat pumps 3 with a corresponding condenser side 14.

Throttle valves 5 are used to increase the hot water temperature in heating mode.

A three-way valve 6 is used to switch over to free cooling mode via the recooler 4. A further three-way valve (7) is used to switch over to emergency mode if there is no load-generating thermal energy (see also FIG. 5).

The components of the data center to be cooled are symbolized by the reference sign 9.

To simplify matters, a first cooling water circuit with direct coupling to the components 9 and a second cooling water circuit with air heat exchanger for indirect coupling are not shown separately.

As can be seen in the figures, a cascade of heat pumps 3 that can be activated individually or in groups and connected in parallel is provided for actual cooling.

On the condenser side 14 of the respective heat pump 3, a switchover from cooling mode for refrigeration to heating mode for space heating of a connected room 1 can be realized by means of a respective three-way valve 10. On the condenser side, controllable throttle valves 5 are arranged downstream of the respective heat pumps 3 so that the volume flow for condenser cooling can be preset.

A flow sensor 17 is located in a heating circuit on the building side (space heating 1) in order to detect a heating requirement. If a heating requirement is detected, the operation of a pump 12 is triggered, whereby the heating water is conveyed in the circuit between a heat exchanger 30 and the respectively activated heat pump(s) 3.

The three-way valve 7 can be used to disconnect from the components 9 and then connect to the recooler 4 via the three-way valve 6 in order to recover thermal energy from the environment.

Figure 2:
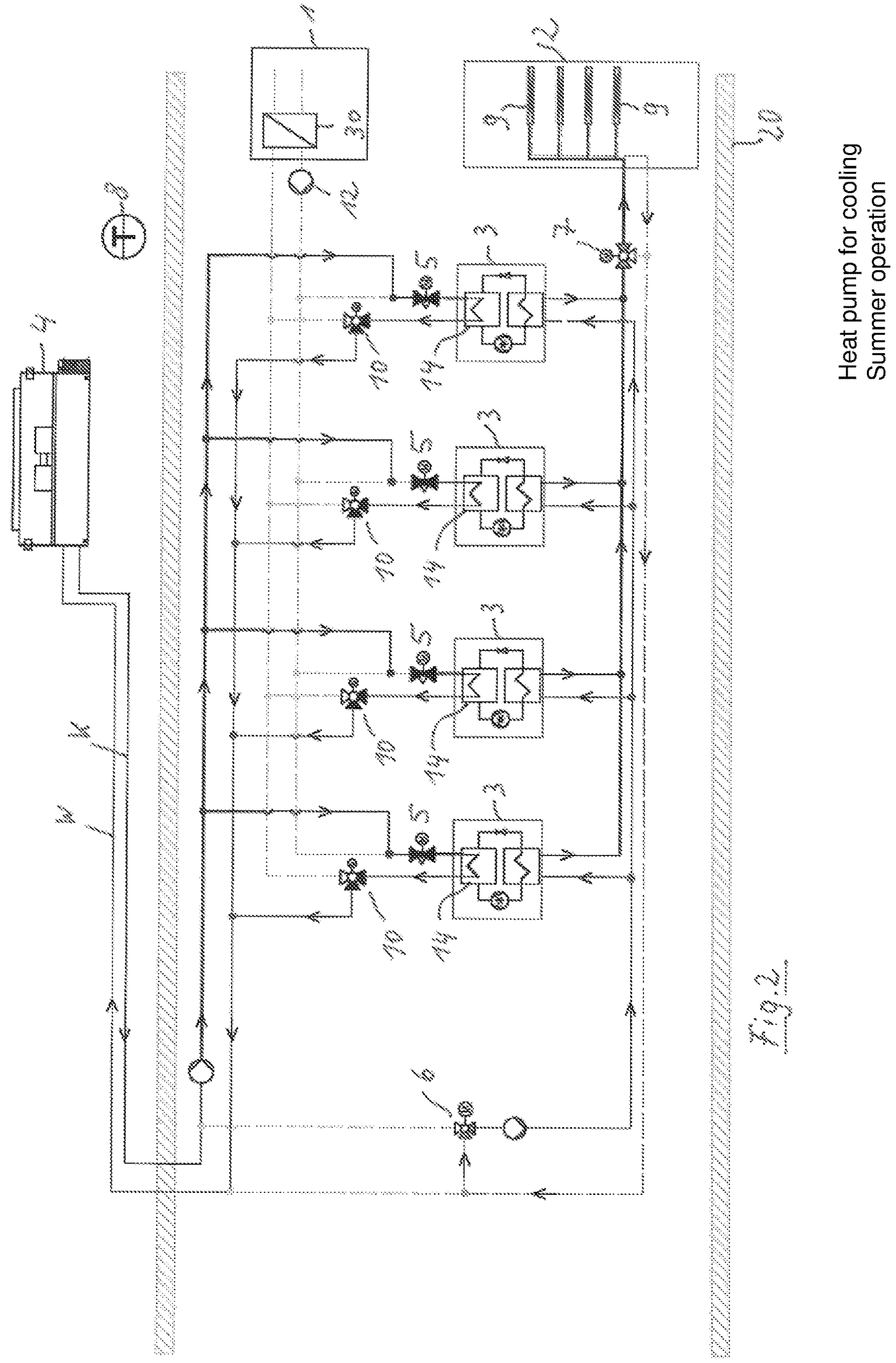
FIG. 2 shows an illustration similar to that in FIG. 1, but with activated heat pumps for cooling a data center in summer operation.

As can be seen from the hydraulic diagram in FIG. 2, the heat pumps 3 are used for cooling in summer operation.

"Summer operation" is when the temperatures in the cold water circuit are below the achievable free cooling temperature.

Additional heat pumps are activated depending on the required cooling capacity.

When a corresponding heat pump 3 is switched on or off, the associated two-way valve 5 is also fully opened or closed.

Where possible, the heat pumps 3 are operated in rotation to ensure even wear against a uniform number of operating hours.

Figure 3:
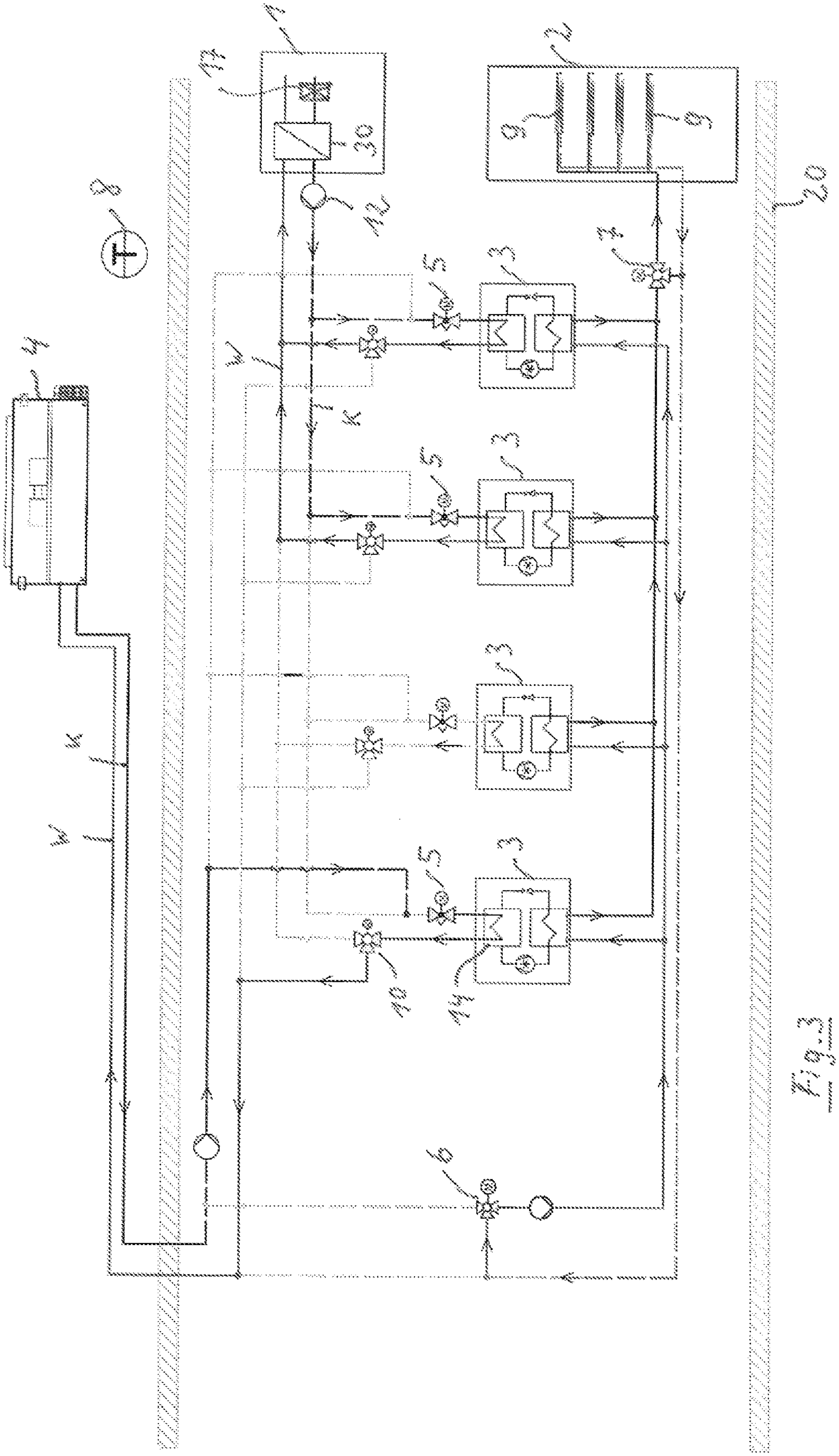
FIG. 3 shows a representation of a simplified hydraulic diagram in a mixed mode for simultaneous heating and cooling, with one of the heat pumps being inactive.

Since heating may also be required in summer, for example if domestic hot water needs to be heated, it is also possible to extract heat during summer operation, as shown in FIG. 3.

A heating request is detected via a flow sensor 17, which is integrated into the building's heating system. If a flow is detected via the sensor 17, the pump 12 is switched on, which conveys the heating water in the circuit between the heat exchanger and the heat pumps 3 active for cooling the data center.

After the pump 12 has been switched on in response to a heating request, a selection is made from the active heat pumps 3 and the volume flow is restricted via the associated two-way valve 5 using a PID controller so that a corresponding outlet temperature from the heat pump 3 of, for example, 60° (this is an adjustable setpoint) is reached and maintained.

As soon as the outlet temperature of the selected heat pump 3 has reached the setpoint, the associated three-way valve is used to direct enough heated water towards heat exchanger 30 via the PID controller so that the outlet temperature from heat exchanger 30 is maintained at an adjustable setpoint of e.g. approx. 55°.

If the heat consumption of the building heating system drops, the regulating system ensures that excess waste heat is transferred to the recooler 4 so that there are no possible high-pressure faults at the corresponding heat pump 3.

If the demand for heating power increases, another heat pump is selected from the active heat pumps 3, whose waste heat is to be fed to the heat exchanger 30.

If no flow is detected by the flow sensor 17, all corresponding valves are closed and switched to cooling mode.

When selecting the heat pumps 3 that feed into the heating circuit with heat exchanger 30, it is advantageous to select only those heat pumps 3 that are already in operation due to the cooling requirements of the components 9.

If a heat pump 3 is switched off due to a decreasing cooling demand of the components 9, the heat pump 3, which is not involved in the heating feed, should be switched to an off state.

If the cooling demand continues to fall, those heat pumps 3 that are involved in the heating supply can also be switched off. The heat pump 3 that is responsible for the output-dependent heating regulation should be the last of the pumps 3 to be switched off when the cooling demand falls.

Figure 4:
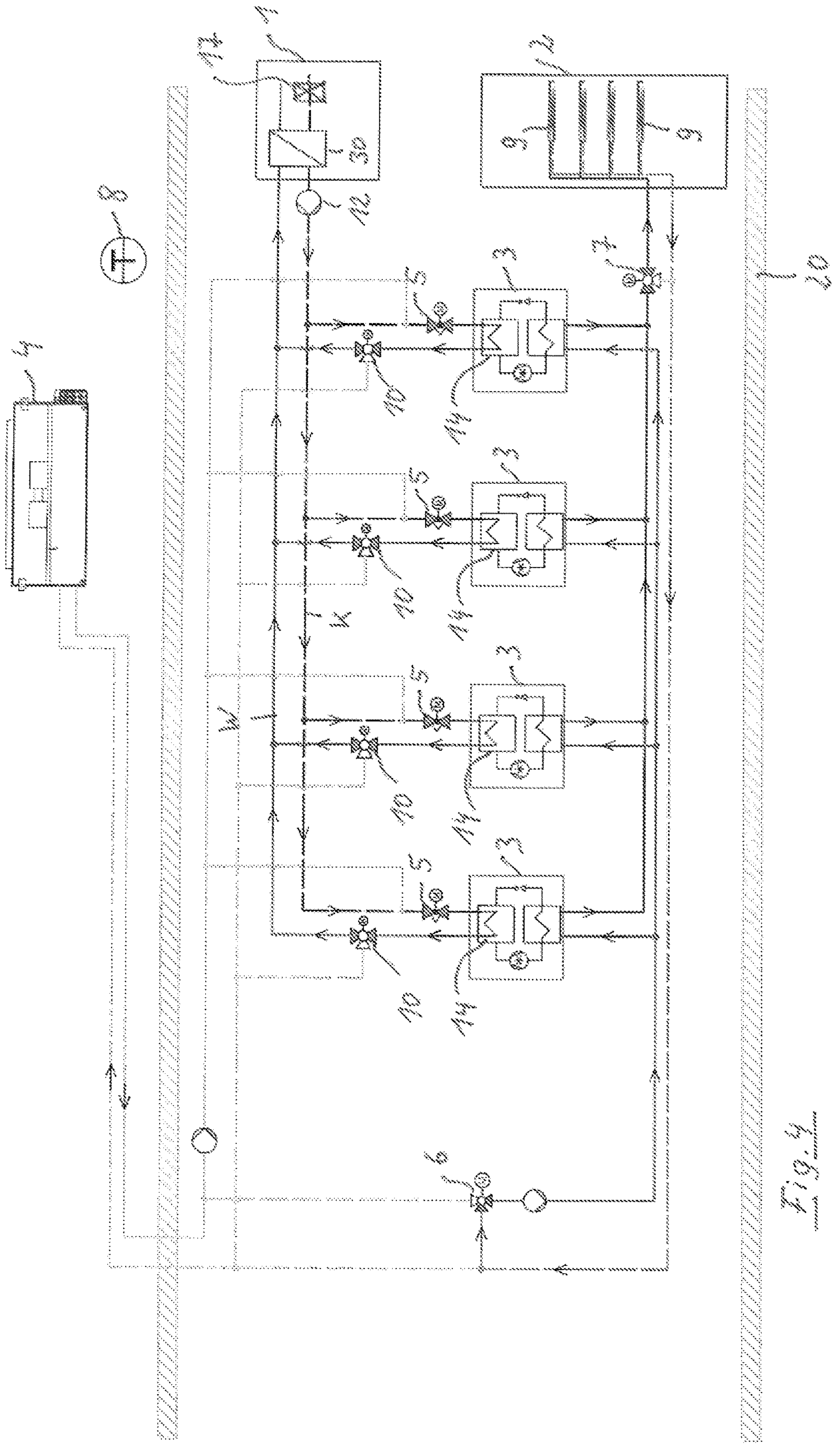
FIG. 4 shows an illustration of a simplified hydraulic diagram, wherein the heat pumps for heating a connected room are in winter operation.

The "winter operation" mode, as shown in the diagram in FIG. 4, is intended for the transitional and winter periods and should be activated when the recooler 4 can take over all or part of the cooling of the cold water circuit due to the lower outside temperature.

During the transitional period, mixed cooling operation takes place, i.e. the chilled water is precooled via the recooler of the heat pumps. The cooling water is then cooled to the target temperature of the air/water heat exchanger via the evaporator side of the heat pumps 3.

In the "winter operation" mode, it is possible to switch on the heat pumps 3 as a result of a heating request.

In this case, the thermal energy on the condenser side 14 of the heat pumps 3 is used for space heating. The corresponding energy is fed to the heat exchanger 30 depending on the heating requirement.

Figure 5:
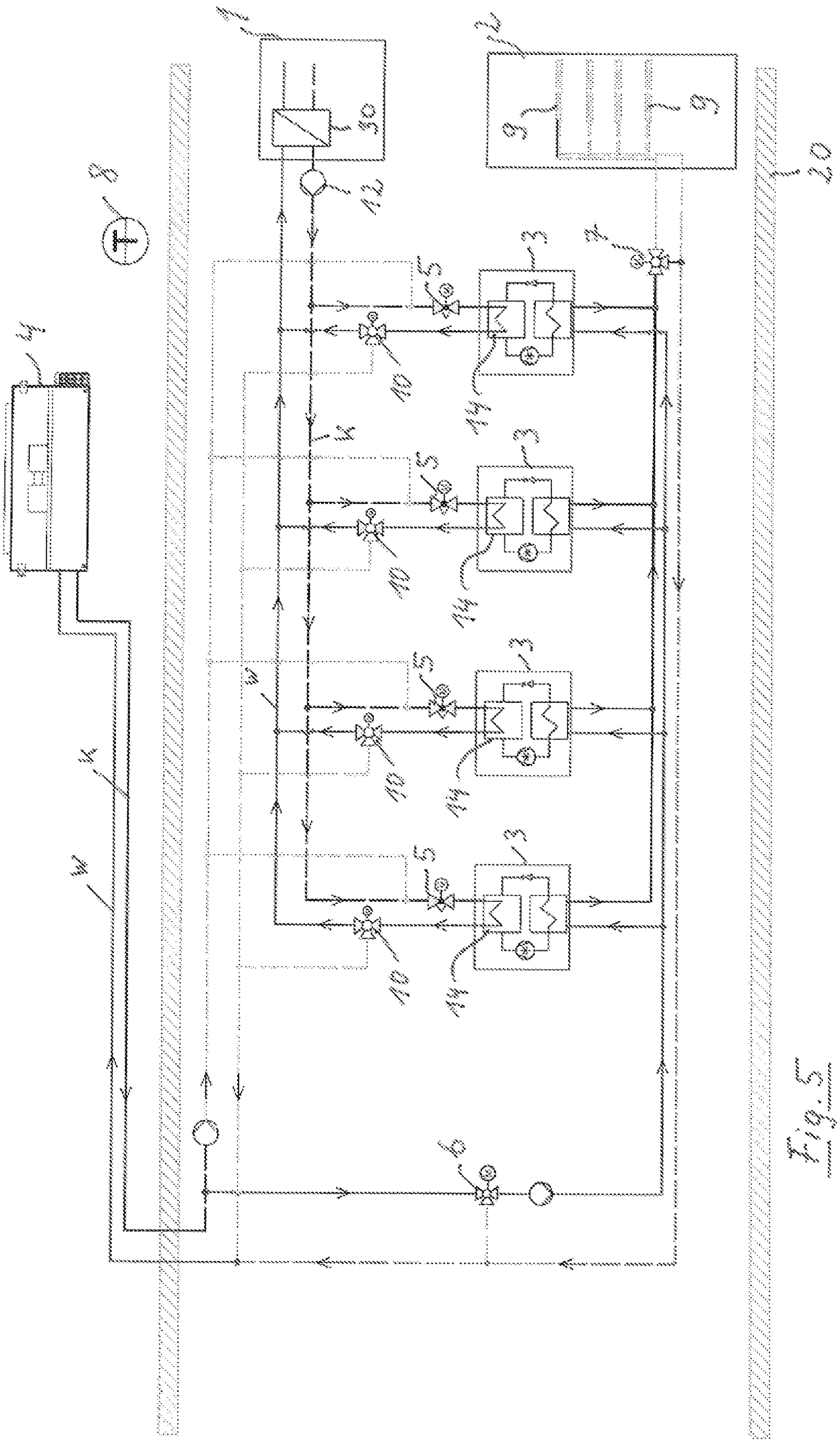
FIG. 5 shows a simplified schematic illustration of emergency operation in the event of failure or maintenance of the data center components with heat recovery from the air to ensure the heating of a connected room.

With the variant shown in the diagram in FIG. 5, emergency heating is possible if the computer technology, i.e. the components 9, have been completely switched off or partially taken out of operation for maintenance purposes.

This makes it possible to provide heat independently of the waste heat from the components. This makes it possible to protect a connected room or the container housing the computing technology from frost damage.

In the mode shown in FIG. 5, the heat pumps 3 operate as air-to-water heat pumps and extract the thermal energy from the outside air.

In addition, pressure sensors can be used to detect leaks in the hydraulic pipe arrangement. An alarm is triggered if the pressure drops. This can also prevent harmful dry running of the pumps used. Differential pressure-controlled pumps are preferably used.

With the solutions according to the described exemplary embodiment, the respective cooling requirements of the computer system as well as the heating requirements of a connected room can be controlled via the heat pump cascade used. In principle, the water heated by the processor or chip cooling can be used to prevent the entire system and, in particular, a connected room to be heated from cooling down.

The invention claimed is:

1. A method for air-conditioning components (9) which generate losses or waste heat, wherein the entirety of the components is located in an enclosure, wherein the components are directly coupled to a first cooling water circuit on one hand and indirectly connected via a second cooling water circuit to an air heat exchanger on the other hand, characterized in that a cascade of heat pumps which are activated individually or in groups and are connected in parallel is provided to generate cooling for the second cooling water circuit, wherein on a condenser side of the respective heat pump, a three-way valve is used to switch from cooling mode for generating cooling to heating mode for a connected heating circuit; and the condensation temperature on the condenser side of the respective heat pump is selected to be lower than in heating mode in order to increase efficiency in cooling mode.

2. The method according to claim 1, characterized in that a controllable throttle valve is arranged downstream of the respective heat pump on the condenser side, so that the volume flow for condenser cooling can be preset.

3. The method according to claim 1, characterized in that a flow sensor is located in the heating circuit on a building side in order to detect a heating requirement and to trigger the operation of a pump, whereby the heating water is conveyed in the circuit between a heat exchanger and the respective active heat pump or pumps.

4. The method according to claim 1, characterized in that the heat pumps are operated alternately or in rotation, so that a number of operating hours which is uniform.

5. The method according to claim 3, characterized in that to control the heat pumps feeding into the heating circuit in summer or transitional operation, preference is given to those which were or are already in operation due to the component cooling.

6. The method according to claim 1, characterized in that at least one of the heat pumps is switched over to operate as an air-to-water heat pump for emergency air-conditioning operation in an event of failure of the waste-heat-generating components.

7. The method according to claim 1, characterized in that the heat pumps are connected to a recooler located on the outside of the enclosure.

8. The method according to claim 1, characterized in that a bypass is formed for transferring thermal energy from the second cooling water circuit with the air heat exchanger into the first cooling water circuit.

9. The method according to claim 7, characterized in that a direct connection of the first or second cooling water circuit to the recooler for free-cooling operation is established via a three-way valve.

10. The method according to claim 6, characterized in that a three-way valve is used to decouple from the components and a connection to the recooler is established by means of the three-way valve in order to recover thermal energy from the environment.

11. The method according to claim 1, wherein the method is for cooling and air-conditioning a container-based data center and connected premises to be heated for administration and operating personnel, wherein the cooling of computers takes place via cold water-fed heat exchangers on or in computer housings for cooling heated air as well as direct hot water cooling of computer components.

12. The method according to claim 1, wherein the components are components of a data center.

13. The method according to claim 1, wherein the entirety of the components is located in a container.

* * * * *